(12) United States Patent
Sakuma et al.

(10) Patent No.: US 12,389,755 B2
(45) Date of Patent: Aug. 12, 2025

(54) DISPLAY DEVICE

(71) Applicant: SHARP KABUSHIKI KAISHA, Sakai (JP)

(72) Inventors: Jun Sakuma, Sakai (JP); Yasushi Asaoka, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 547 days.

(21) Appl. No.: 17/795,858

(22) PCT Filed: Feb. 14, 2020

(86) PCT No.: PCT/JP2020/005881
§ 371 (c)(1),
(2) Date: Jul. 27, 2022

(87) PCT Pub. No.: WO2021/161528
PCT Pub. Date: Aug. 19, 2021

(65) Prior Publication Data
US 2023/0064913 A1    Mar. 2, 2023

(51) Int. Cl.
*H10K 59/30*     (2023.01)
*H10K 59/121*    (2023.01)
*H10K 59/122*    (2023.01)
*H10K 59/123*    (2023.01)

(52) U.S. Cl.
CPC ....... *H10K 59/123* (2023.02); *H10K 59/1213* (2023.02); *H10K 59/122* (2023.02); *H10K 59/30* (2023.02)

(58) Field of Classification Search
CPC .... H10K 59/123; H10K 59/30; H10K 59/122; H10K 59/1213
USPC ......................................................... 349/139
See application file for complete search history.

(56) References Cited

U.S. PATENT DOCUMENTS

| 2009/0008713 | A1  | 1/2009  | Kawashima |
| 2012/0292621 | A1* | 11/2012 | Kim ................... H10K 59/122 438/34 |
| 2014/0152171 | A1  | 6/2014  | Kondoh |
| 2015/0037935 | A1  | 2/2015  | Kim et al. |

FOREIGN PATENT DOCUMENTS

| JP | 2009-015098 A  | 1/2009 |
| JP | 2011-044271 A  | 3/2011 |
| WO | 2013/046275 A1 | 4/2013 |

* cited by examiner

*Primary Examiner* — Christopher M Raabe
(74) *Attorney, Agent, or Firm* — ScienBiziP, P.C.

(57) ABSTRACT

A display device includes at least the following: a single contact hole; n TFTs, where n is a natural number equal to or greater than two; and n electrodes, wherein the n electrodes are electrically connected to the respective n TFTs via the single contact hole.

17 Claims, 10 Drawing Sheets

DISPLAY DEVICE

TECHNICAL FIELD

The disclosure relates to a display device.

BACKGROUND ART

An example of display devices is a technique disclosed in Patent Literature 1. This display device disclosed in Patent Literature 1 includes a display panel device. In the display panel device, a first electrode has, for each of partitioned flattening film, an edge disposed in a groove provided between pixel portions, and covering the entire upper surface and side surfaces of the flattening film to seal the flattening film.

CITATION LIST

Patent Literature

Patent Literature 1: Japanese Unexamined Patent Application Publication No. 2011-44271 (published on Mar. 3, 2011)

SUMMARY

Technical Problem

In the display panel device disclosed in Patent Literature 1, a single first electrode is electrically connected to a single drive transistor via a single contact hole. Thus, the display panel device disclosed in Patent Literature 1 has many contact holes and a large total area of contact hole formation, thereby reducing the area of formation of light-emitting layers. Hence, increasing display luminance is unfortunately difficult in the display device disclosed in Patent Literature 1.

One aspect of the disclosure aims to achieve a display device that easily achieves high luminance.

Solution to Problem

A display device according to one aspect of the disclosure includes at least the following: a single contact hole; n TFTs, where n is a natural number equal to or greater than two; and n electrodes, wherein the n electrodes are electrically connected to the respective n TFTs via the single contact hole.

Advantageous Effect of Disclosure

The aspect of the disclosure can achieve a display device that easily achieves high luminance.

DESCRIPTION OF EMBODIMENTS

The embodiments of the disclosure will be described with reference to the drawings. It is noted that for convenience in description, components having the same functions as previously described components will be denoted by the same signs, and that their description will not be repeated in some cases. It is also noted that each drawing in some cases omits components irrelevant to the main subject of the disclosure.

First Embodiment

Figure 1:
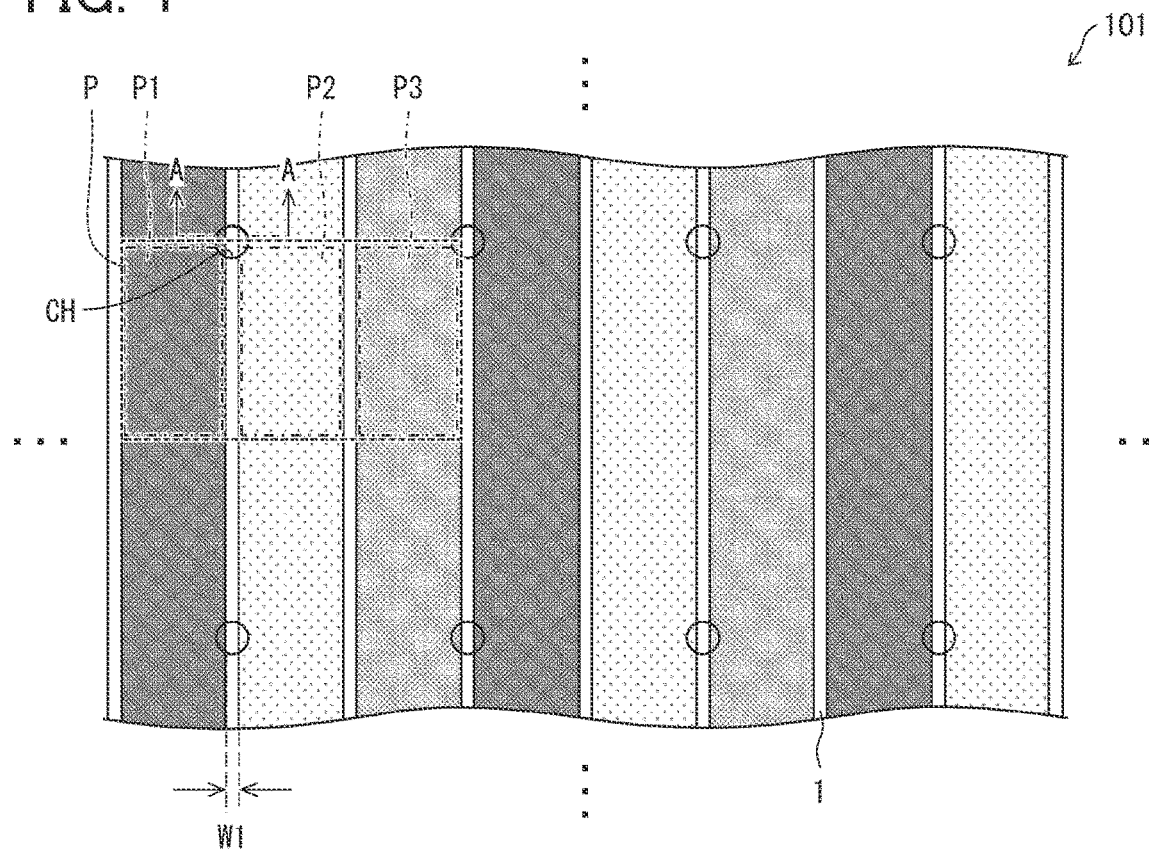
FIG. 1 is a plan view of a schematic configuration of a display device according to a first embodiment of the disclosure.

FIG. 1 is a plan view of a schematic configuration of a display device 101 according to a first embodiment of the disclosure. In FIG. 1, an imaginary line denoting a plurality of contact holes CH formed in the display device 101 is drawn.

The display device 101 includes a plurality of pixels P. FIG. 1 illustrates four of the plurality of pixels P. However, the number of pixels P is not particularly limited.

Each of the plurality of pixels P includes a first sub-pixel P1, a second sub-pixel P2, and a third sub-pixel P3. The first sub-pixel P1 emits light of a first color, the second sub-pixel P2 emits light of a second color, and the third sub-pixel P3 emits light of a third color. The first color, the second color, and the third color are different from each other. In the display device 101, the first color, which is emitted by the first sub-pixel P1, is red, the second color, which is emitted by the second sub-pixel P2, is green, and the third color, which is emitted by the third sub-pixel P3, is blue. However, each of the first color, the second color and the third color is not limited to the foregoing color. The first color, the second color and the third color may be any colors different from each other.

The display device 101 also includes a partition wall 1. The partition wall 1 is also called a bank or a black matrix. The partition wall 1 has the function of avoiding color mixture of light of the first color, emitted by the first sub-pixel P1, light of the second color, emitted by the second sub-pixel P2, and light of the third color, emitted by the third sub-pixel P3. The partition wall 1 is formed between the first sub-pixel P1 and the second sub-pixel P2, between the second sub-pixel P2 and the third sub-pixel P3, and between the third sub-pixel P3 and the first sub-pixel P1. In the display device 101, no partition wall 1 is formed between two first sub-pixels P1, between two second sub-pixels P2, and between two third sub-pixels P3.

Figure 2:
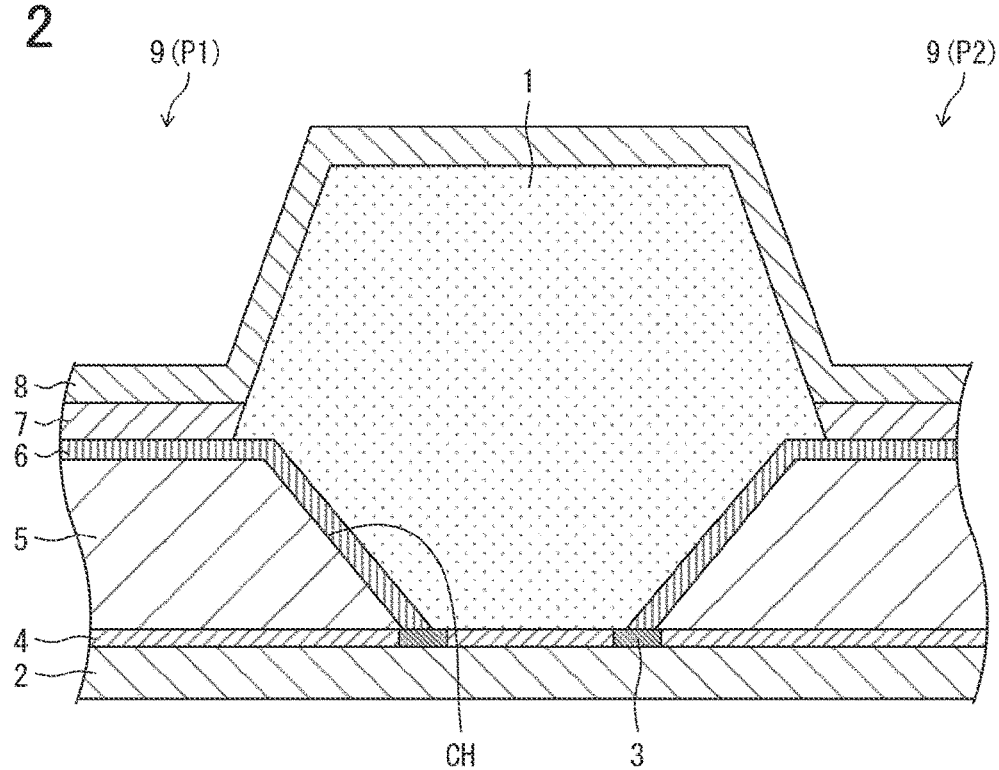
FIG. 2 is a sectional view taken along line A-A in FIG. 1.

FIG. 2 is a sectional view taken along line A-A in FIG. 1. The display device 101 includes the following: the partition wall 1; a substrate 2; n thin-film transistors (TFTs) 3, where n is a natural number equal to or greater than two; a wire layer 4; a flattening film 5; n electrodes 6; n light-emitting layers 7; and a common electrode 8. The display device 101 also has contact holes (a single contact hole) CH. FIG. 2 illustrates only two TFTs 3.

The display device 101 includes a single light-emitting element 9 per first sub-pixel P1, a single light-emitting element 9 per second sub-pixel P2, and a single light-emitting element 9 per third sub-pixel P3. A single light-emitting element 9 has a single electrode 6, a single light-emitting layer 7, and the common electrode 8. Each of the first sub-pixel P1, the second sub-pixel P2 and the third sub-pixel P3 corresponds to the single light-emitting element 9 included in the sub-pixel, by extension, to the single electrode 6 and single light-emitting layer 7 included in the single light-emitting element 9. In contrast, the common electrode 8 is common to all the light-emitting elements 9.

With regard to each of the first sub-pixel P1, the second sub-pixel P2 and the third sub-pixel P3, a region where the corresponding electrode 6, the corresponding light-emitting layer 7, and the common electrode 8 overlap one another is specified as a light emission region. In the light emission region, when the electrode 6 is an anode, and the common electrode 8 is a cathode, current flows from the electrode 6 through the common electrode 8, thus allowing the light-emitting layer 7 to emit light.

The partition wall 1 defines the light-emitting layers 7. Forming the partition wall 1, followed by providing a light-emitting material to form the light-emitting layers 7 enables the partition wall 1 to block the light-emitting material.

The light-emitting layers 7 are each a light-emitting layer including a self-emission element. Examples of the self-emission element include an organic light-emitting diode (OLED), a quantum-dot light-emitting diode (QLED), and an inorganic light-emitting diode.

The substrate 2 includes a base for instance. Examples of the material of the base include glass and resins. Further, the substrate 2 may be composed of at least one resin layer and a barrier layer stacked in this order on the base. An example of the material of the resin layer is polyimide. The barrier layer is a layer that prevents moisture and/or impurities from reaching the TFTs 3 and/or the light-emitting layers 7 when the display device 101 is used. Examples of the barrier layer include a silicon oxide film, a silicon nitride film, and a silicon oxide nitride film, which are formed through chemical vapor deposition (CVD), as well as a laminate of these films.

Further, it can be interpreted that in the display device 101, n light-emitting elements 9 are provided on the substrate 2. In this interpretation, each of the n light-emitting elements 9 has, in sequence on the substrate 2, a corresponding one of the n electrodes 6, a corresponding one of the n light-emitting layers 7, and the common electrode 8, which is common to the n light-emitting elements 9.

The n electrodes 6 are electrically connected to the respective n TFTs 3 via the contact holes CH. The n TFTs 3 individually drive the n light-emitting elements 9. The wire layer 4 includes wires necessary for controlling the n TFTs 3.

The contact holes CH are formed in the flattening film 5. The flattening film 5 is provided between the n TFTs 3 and then electrodes 6. An example of the material of the flattening film 5 is an organic material that can be applied, including polyimide and acrylic.

The display device 101, which can reduce the total number of contact holes CH, easily achieves high luminance by increasing aperture ratio.

The contact holes CH are formed directly under the partition wall 1. This can easily achieve a contact hole cover covering the contact holes CH by the use of the partition wall 1.

Although FIG. 2 illustrates only two TFTs 3, FIG. 1 shows that n is equal to four in the display device 101. That is, the display device 101 has four electrodes 6 electrically connected to respective four TFTs 3 via a single contact hole CH. Further, the single contact hole CH is formed in a circle in a top view, as illustrated in FIG. 1.

The display device 101 has n electrodes 6 provided for each contact hole CH; in other words, the display device 101 has a plurality of sets of n electrodes 6. Further, in the display device 101, two first sub-pixels P1 are adjacent to each other. Furthermore, the minimum value of distance between the two first sub-pixels P1 is smaller than the minimum value of distance between either of the two first sub-pixels P1 and the second sub-pixel P2. It is noted in the display device 101 that no partition wall 1 is formed between the two first sub-pixels P1, and that the two first sub-pixels P1 are in contact together; hence, the minimum value of distance between the two first sub-pixels P1 is regarded as being equal to zero. In contrast, in the display device 101, the minimum value of distance between either of the two first sub-pixels P1 and the second sub-pixel P2 is equal to a width W1 of the partition wall 1.

The first sub-pixels P1 all emit light of the first color, thus eliminating the need for avoiding color mixture of light between the two first sub-pixels P1. Hence, the minimum value of distance between the two first sub-pixels P1 can be rendered smaller than the minimum value of distance between the first sub-pixel P1 and the second sub-pixel P2. Consequently, the display device 101 easily achieves high luminance by increasing aperture ratio.

Further, each of a plurality of first sub-pixels P1 constituting a single column in the display device 101 has the light-emitting layer 7 that emits light of the first color, and the light-emitting layers 7 of the individual first sub-pixels P1 are formed integrally.

This can avoid the display device 101 from resulting in a faulty finished product resulting from a positional deviation of at least one light-emitting layer 7 in the direction where the mutually integrated light-emitting layers 7 are arranged, during the manufacture of the display device 101. Consequently, the display device 101 with high manufacturing yield can be achieved. And/or, accuracy required in apparatuses for manufacturing the display device 101 (a film formation apparatus in particular) can be lowered.

Further, as described above, in the display device 101, no partition wall 1 is formed between two first sub-pixels P1. Avoiding color mixture of light between the two first sub-pixels P1 is not necessary, thus eliminating the need for forming a partition wall 1 between the two first sub-pixels P1. This can render the minimum value of distance between the two first sub-pixels P1 smaller than the minimum value of distance between the first sub-pixel P1 and the second sub-pixel P2.

It is noted that although the foregoing has discussed the minimum value of distance between the first sub-pixel P1 and the second sub-pixel P2, a similar discussion can be established between the second sub-pixel P2 and the third sub-pixel P3, and between the third sub-pixel P3 and the first sub-pixel P1.

Figure 3:
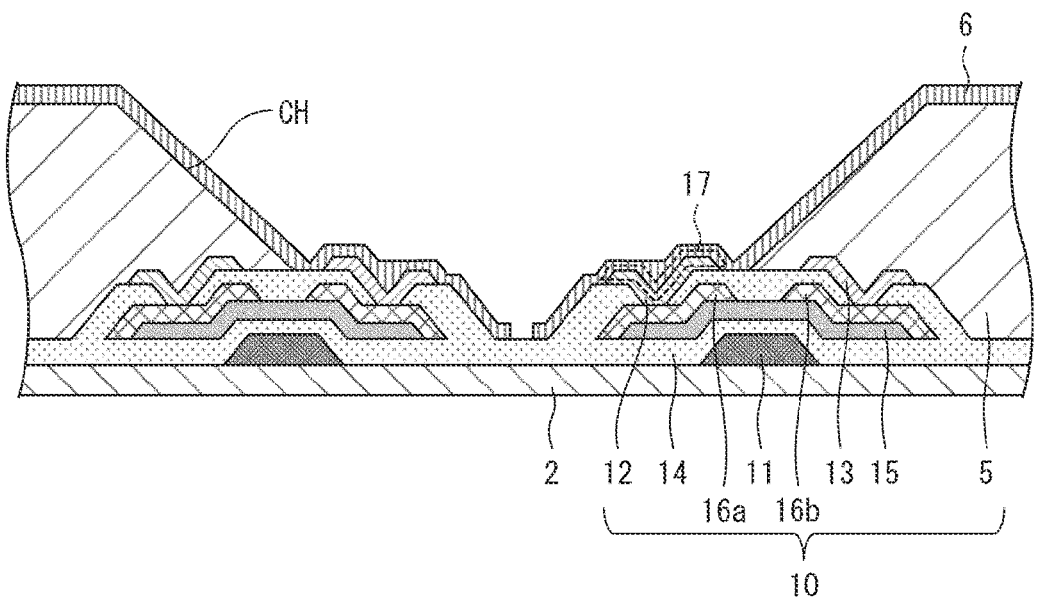
FIG. 3 is a sectional view of a first specific example where an electrode and a TFT are electrically connected together via a contact hole.

FIG. 3 is a sectional view of a first specific example where the electrode 6 and the TFT 3 are electrically connected together via a contact hole CH. In the first specific example, the display device 101 has a TFT layer 10. The TFT layer 10 includes the TFT 3, the wire layer 4, and the flattening film 5. The TFT layer 10 has the flattening film 5, a gate 11 of the TFT 3, a source 12 of the TFT 3, a drain 13 of the TFT 3, an interlayer insulating film 14, a semiconductor portion 15, a semiconductor portion 16a, and a semiconductor portion 16b.

The interlayer insulating film 14 is formed on the gate 11. The interlayer insulating film 14 can be composed of, for instance, a silicon oxide (SiOx) film or a silicon nitride (SiNx) film, which are formed through CVD, or a laminate of these films.

The semiconductor portion 15 is formed on the interlayer insulating film 14. The semiconductor portion 16a and the semiconductor portion 16b are both formed on the semiconductor portion 15. In the cross section illustrated in FIG. 3, the semiconductor portion 16a is formed at the left end of the semiconductor portion 15, and the semiconductor portion 16b is formed at the right end of the same. The interlayer insulating film 14 is formed also on a set of the semiconductor portion 15, the semiconductor portion 16a and the semiconductor portion 16b. Each of the semiconductor portion 15, the semiconductor portion 16a and the semiconductor portion 16b is composed of, for instance, low-temperature polysilicon (LTPS) or an oxide semiconductor (e.g., an In—Ga—Zn—O semiconductor).

The source 12 is formed on the semiconductor portion 16a and is connected to the semiconductor portion 16a. The drain 13 is formed on the semiconductor portion 16b and is connected to the semiconductor portion 16b.

Moreover, the source 12 is connected to the electrode 6 at a contact portion 17. It is noted that the drain 13 is connected to a power source line ELV (see FIG. 14). The contact portion 17 is located directly over at least one of the gate 11, the semiconductor portion 15, the semiconductor portion 16a and the semiconductor portion 16b.

Applying the structure in FIG. 3 to at least one of the n TFTs 3 offers at least one of the n TFTs 3 that is disposed to face the opening of a single contact hole CH. That something is disposed to face the opening of a contact hole CH" refers to that a region inside the outer edge of the contact hole CH and a component that is a target facing the thing (herein, at least one of the n TFTs 3) overlap each other.

Figure 4:
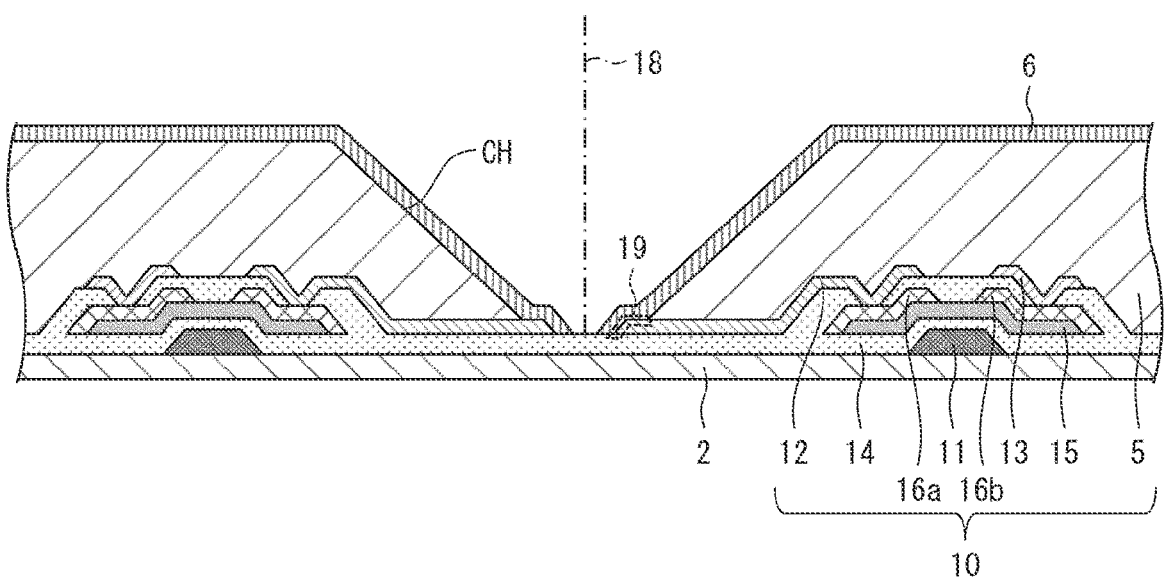
FIG. 4 is a sectional view of a second specific example where the electrode and the TFT are electrically connected together via the contact hole.

FIG. 4 is a sectional view of a second specific example where the electrode 6 and the TFT 3 are electrically connected together via the contact hole CH. The second specific example is different from the first specific example in the following point.

That is, the gate 11, the drain 13, the semiconductor portion 15, the semiconductor portion 16a, and the semiconductor portion 16b are distant away from an axis 18 of the contact hole CH when compared to those in the first specific example. The source 12 is connected to the electrode 6 at a contact portion 19. The contact portion 19 is not located directly over any of the gate 11, the semiconductor portion 15, the semiconductor portion 16a and the semiconductor portion 16b.

Figure 5:
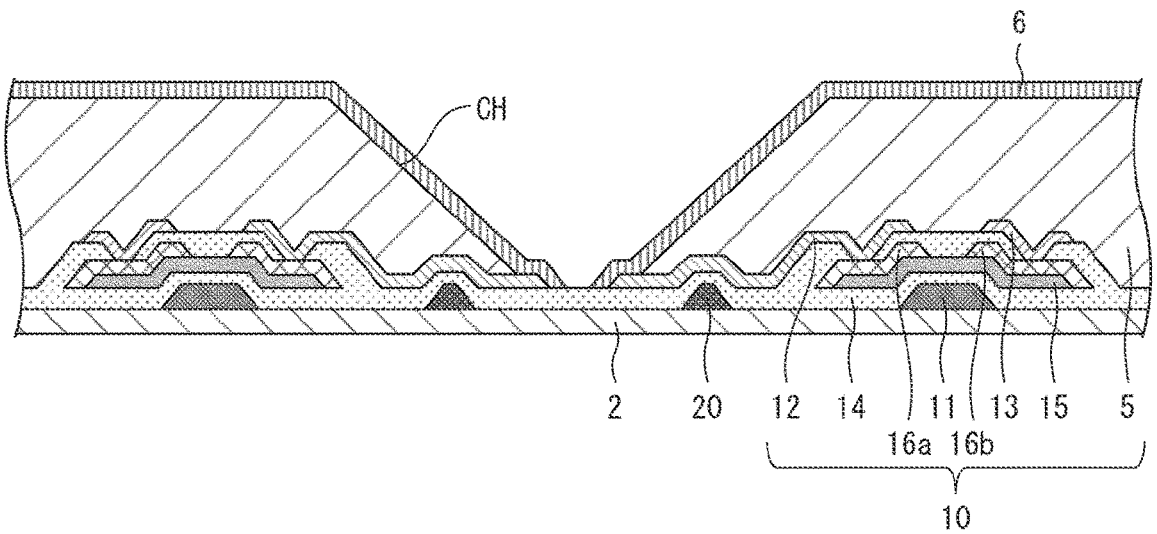
FIG. 5 is a sectional view of a third specific example where the electrode and the TFT are electrically connected together via the contact hole.

FIG. 5 is a sectional view of a third specific example where the electrode 6 and the TFT 3 are electrically connected together via the contact hole CH. The third specific example is different from the second specific example in the following point.

That is, wires 20 are further formed in the third specific example. The interlayer insulating film 14 is formed on the wires 20. The source 12 is accordingly formed to protrude directly over the wires 20.

The interlayer insulating film 14 is interposed between the wires 20 and the source 12, thus enabling the source 12 and the wires 20 to intersect freely.

Second Embodiment

Figure 6:
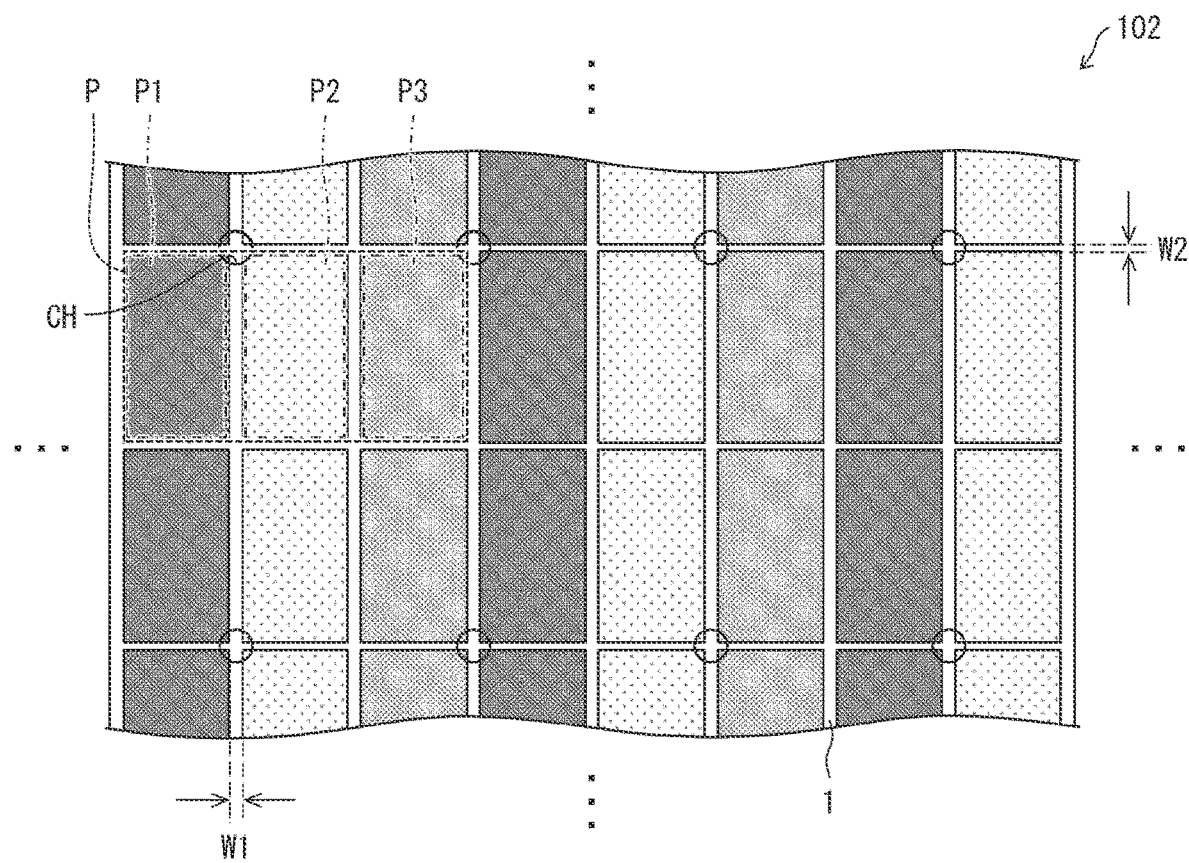
FIG. 6 is a plan view of a schematic configuration of a display device according to a second embodiment of the disclosure.

FIG. 6 is a plan view of a schematic configuration of a display device 102 according to a second embodiment of the disclosure. In FIG. 6, an imaginary line denoting a plurality of contact holes CH formed in the display device 102 is drawn.

The display device 102 has a partition wall 1 formed between two first sub-pixels P1 as well. The width (i.e., a width W2) of the partition wall 1 formed between the two first sub-pixels P1 is smaller than the width (i.e., a width W1) of a partition wall 1 formed between the first sub-pixel P1 and a second sub-pixel P2.

Avoiding color mixture of light between the two first sub-pixels P1 is not necessary, thus enabling reduction in the width of the partition wall 1 formed between the two first sub-pixels P1. This can render the minimum value of distance between the two first sub-pixels P1 smaller than the minimum value of distance between the first sub-pixel P1 and the second sub-pixel P2.

Third Embodiment

Figure 7:
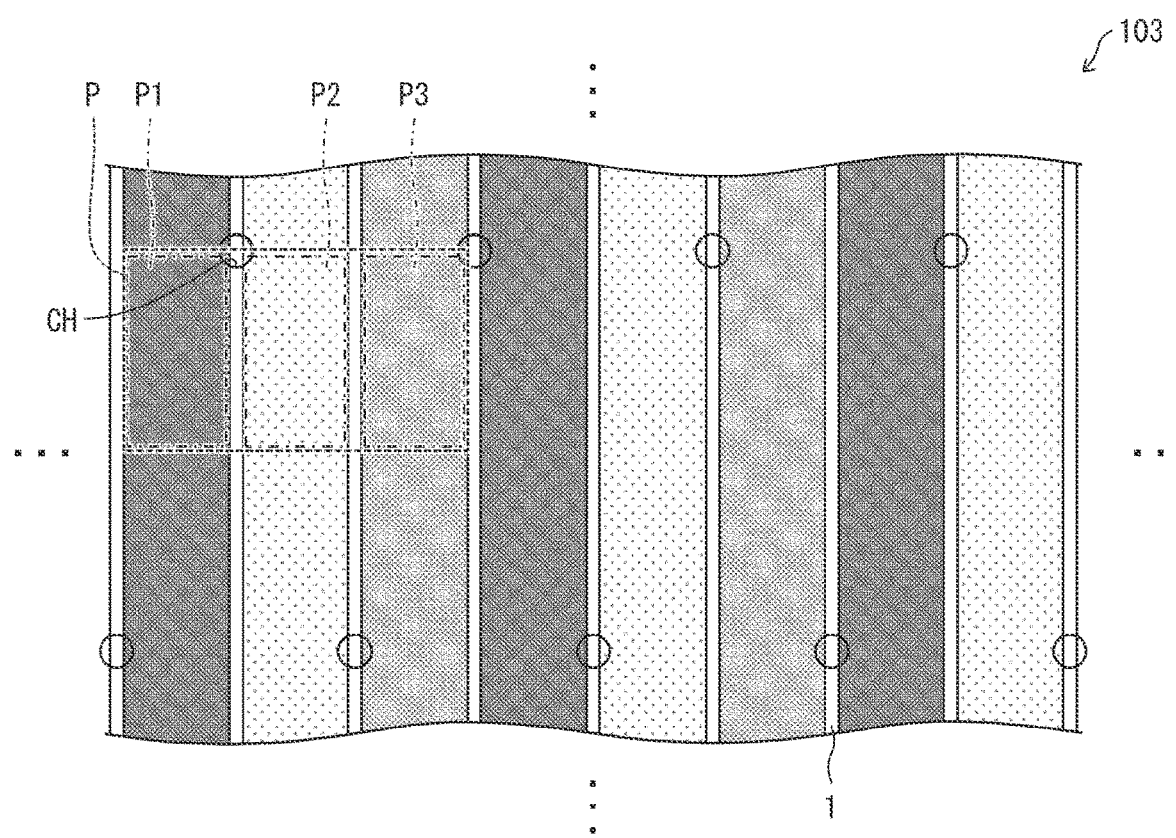
FIG. 7 is a plan view of a schematic configuration of a display device according to a third embodiment of the disclosure.

FIG. 7 is a plan view of a schematic configuration of a display device 103 according to a third embodiment of the disclosure. In FIG. 7, an imaginary line denoting a plurality of contact holes CH formed in the display device 103 is drawn.

The display device 103 is different from the display device 101 in the location where some of the plurality of contact holes CH are formed. That is, the display device 101 has a plurality of contact holes CH disposed in a lattice manner, whereas the display device 103 has a plurality of contact holes CH disposed in a zigzag manner. To be specific, in the display device 103, four contact holes CH at the top of FIG. 7 and five contact holes CH at the bottom of the same are staggered by the shorter-sides of a single first sub-pixel P1, a single second sub-pixel P2 or a single third sub-pixel P3.

Fourth Embodiment

Figure 8:
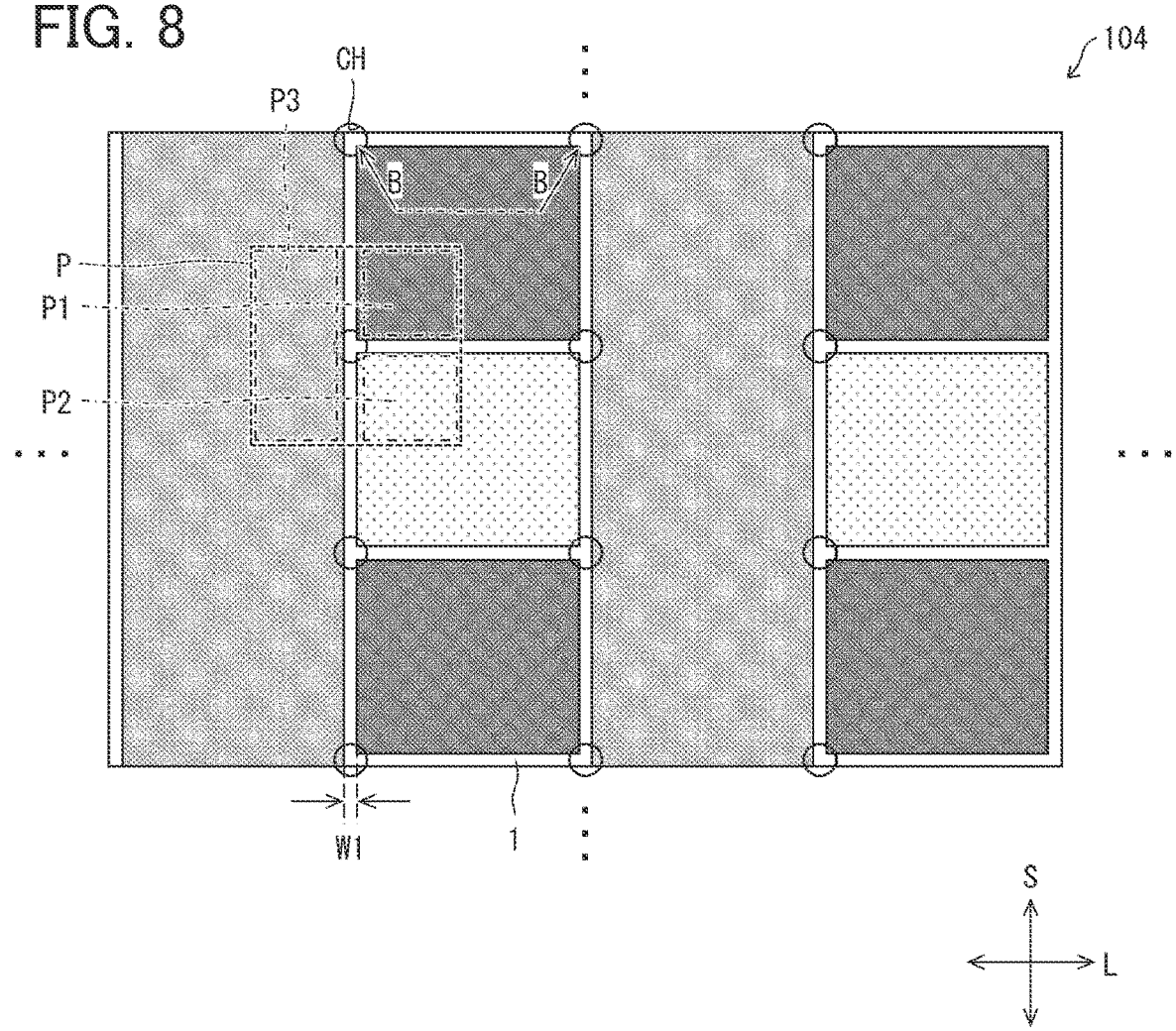
FIG. 8 is a plan view of a schematic configuration of a display device according to a fourth embodiment of the disclosure.

FIG. 8 is a plan view of a schematic configuration of a display device 104 according to a fourth embodiment of the disclosure. In FIG. 8, an imaginary line denoting a plurality of contact holes CH formed in the display device 104 is drawn.

The display device 104 is different from the display device 101 in the following point. FIG. 8 illustrates six of a plurality of pixels P. In FIG. 8, n is equal to three in the display device 104.

In the display device 101, the area of the first sub-pixel P1, the area of the second sub-pixel P2, and the area of the third sub-pixel P3 establish a ratio of 1:1:1. Moreover, in the display device 101, the first sub-pixel P1, the second sub-pixel P2, and the third sub-pixel P3 are disposed in a stripe manner.

In the display device 104 by contrast, the area of the first sub-pixel P1, the area of the second sub-pixel P2, and the area of the third sub-pixel P3 establish a ratio of 1:1:2. Moreover, in the display device 104, the first sub-pixel P1, the second sub-pixel P2, and the third sub-pixel P3 are disposed to form a single square (in a square manner).

Here, in FIG. 8, the direction where the first sub-pixel P1 and the second sub-pixel P2 are arranged (the longitudinal direction in FIG. 8) is defined as a direction S, and the direction where the first sub-pixel P1 and the third sub-pixel P3 are arranged as well as the direction where the second sub-pixel P2 and the third sub-pixel P3 are arranged (the lateral direction in FIG. 8) are defined as a direction L. The direction S and the direction L are perpendicular to each other.

The display device 104 has a plurality of first sub-pixels P1 disposed together in the direction S, and a plurality of first sub-pixels P1 disposed together in the direction L. Each of the plurality of first sub-pixels P1 disposed together has a light-emitting layer 7 that emits light of the first color, and the light-emitting layers 7 of the individual first sub-pixels P1 are formed integrally.

Figure 9:
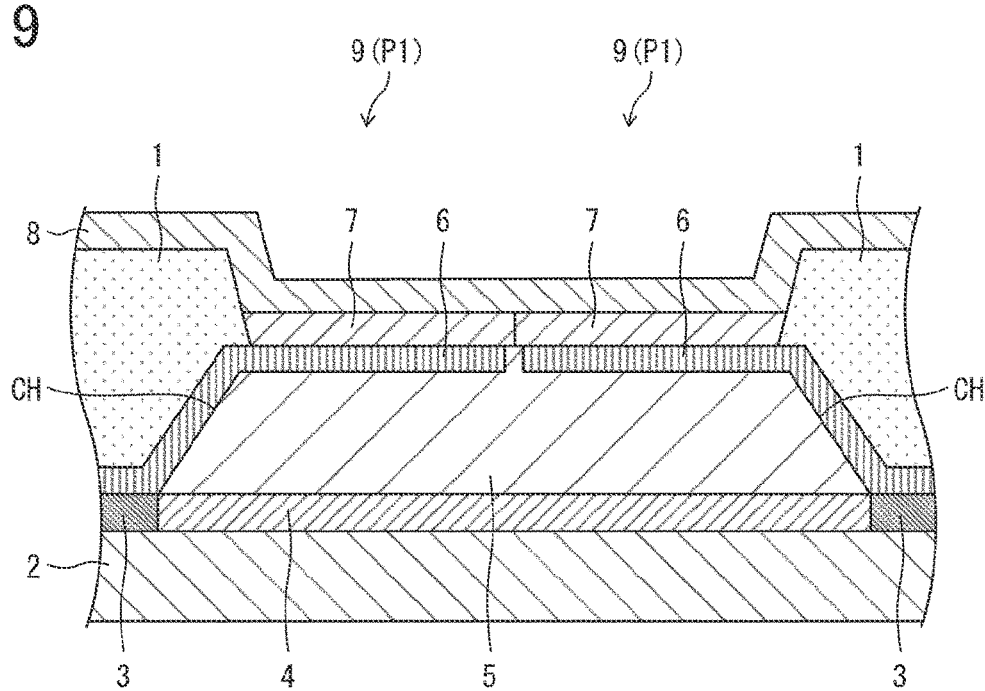
FIG. 9 is a sectional view taken along line B-B in FIG. 8.

FIG. 9 is a sectional view taken along line B-B in FIG. 8. FIG. 9 shows that the light-emitting layers 7 of two first sub-pixels P1 disposed together in the direction L are formed integrally.

This can avoid the display device 104 from resulting in a faulty finished product resulting from a positional deviation of at least one light-emitting layer 7 in the direction where the mutually integrated light-emitting layers 7 are arranged, that is, both in the direction S and the direction L, during the manufacture of the display device 104. Consequently, the display device 104 with high manufacturing yield can be achieved. And/or accuracy, required in apparatuses for manufacturing the display device 104 (a film formation apparatus in particular) may be lower than accuracy required in the apparatuses for manufacturing the display device 101.

The display device 104 has n electrodes 6 provided for each contact hole CH; in other words, the display device 104 has a plurality of sets of n electrodes 6. Further, the display device 104 has three (in FIG. 8, one more, i.e., four) first sub-pixels P1 adjacent to each other in rows and columns. Here, that first sub-pixels P1 adjacent in rows and columns refers to that the first sub-pixels P1 are adjacent to each other in a certain direction (e.g., direction S) and are adjacent to each other in a direction (e.g., direction L) perpendicular to the certain direction. Furthermore, the minimum value of distance between two of the three first sub-pixels P1 is smaller than the minimum value of distance between any of the three first sub-pixels P1 and the second sub-pixel P2. In the display device 104, the minimum value of distance between two of the three first sub-pixels P1 is regarded as being equal to zero, and the minimum value of distance between any of the three first sub-pixels P1 and the second sub-pixel P2 is equal to the width W1 of a partition wall 1.

The first sub-pixels P1 all emit light of the first color, thus eliminating the need for avoiding color mixture of light between the two first sub-pixels P1. Hence, the minimum value of distance between the two first sub-pixels P1 can be rendered smaller than the minimum value of distance between the first sub-pixel P1 and the second sub-pixel P2. Consequently, the display device 104 easily achieves high luminance by increasing aperture ratio.

Fifth Embodiment

Figure 10:
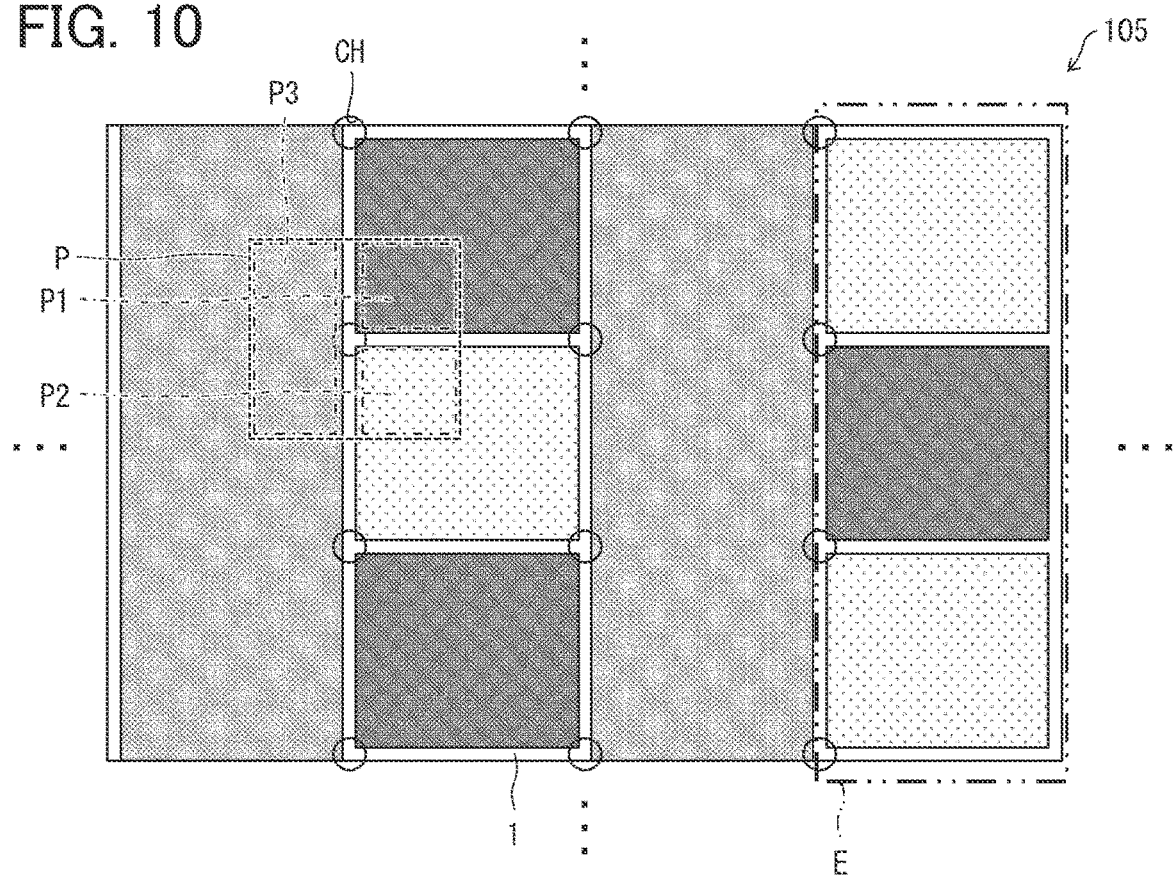
FIG. 10 is a plan view of a schematic configuration of a display device according to a fifth embodiment of the disclosure.

FIG. 10 is a plan view of a schematic configuration of a display device 105 according to a fifth embodiment of the disclosure. In FIG. 10, an imaginary line denoting a plurality of contact holes CH formed in the display device 105 is drawn.

The display device 105 has a region E, where the placement of a first sub-pixel P1 and a second sub-pixel P2 changes from that in the display device 104.

Sixth Embodiment

Figure 11:
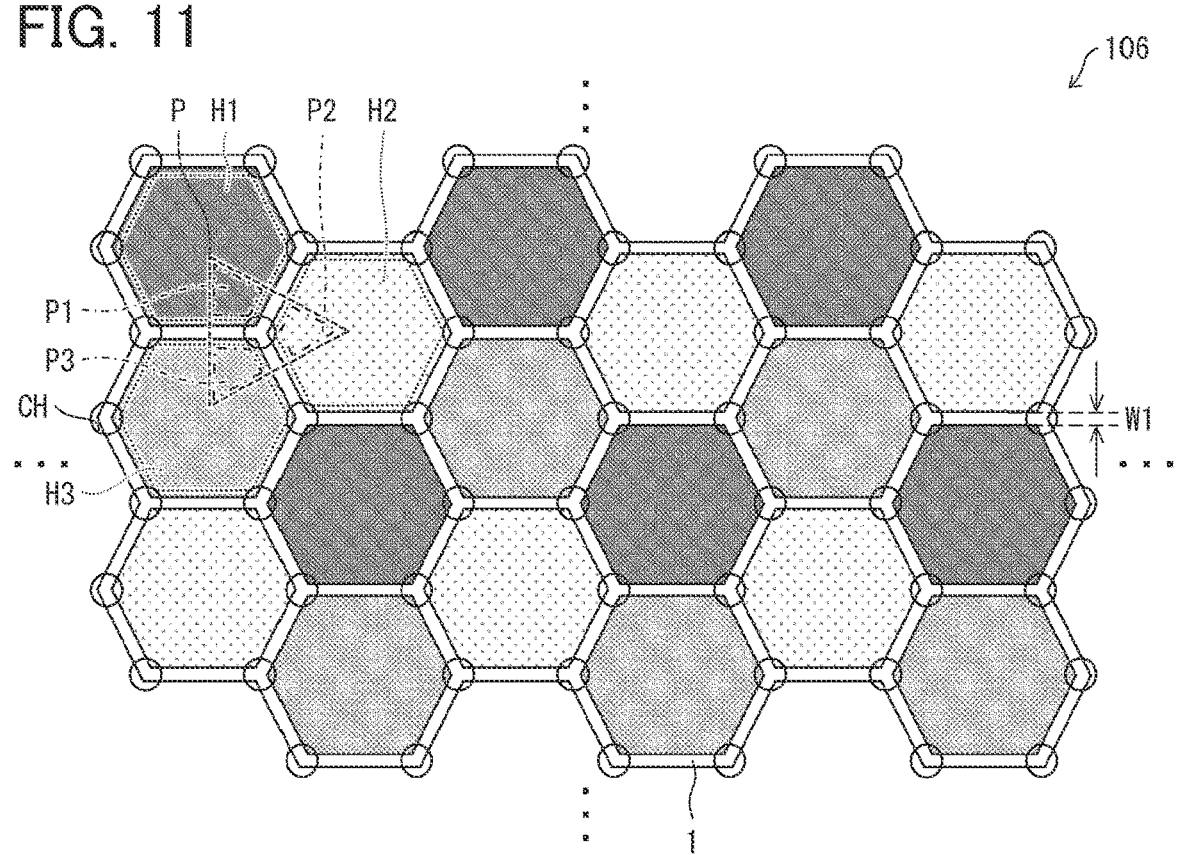
FIG. 11 is a plan view of a schematic configuration of a display device according to a sixth embodiment of the disclosure.

FIG. 11 is a plan view of a schematic configuration of a display device 106 according to a sixth embodiment of the disclosure. In FIG. 11, an imaginary line denoting a plurality of contact holes CH formed in the display device 106 is drawn.

The display device 106 is different from the display device 101 in the following point. FIG. 11 illustrates twenty of a plurality of pixels P. In FIG. 11, n is equal to three in the display device 106.

In the display device 106, each of the plurality of pixels P includes a single first sub-pixel P1, a single second sub-pixel P2, and a single third sub-pixel P3 disposed triangularly.

The display device 106 has six first sub-pixels P1 disposed together. Each of the six first sub-pixels P1 disposed together has a light-emitting layer 7 that emits light of the first color, and the light-emitting layers 7 of the individual first sub-pixels P1 are formed integrally.

This can avoid the display device 106 from resulting in a faulty finished product resulting from a positional deviation of at least one light-emitting layer 7 in the direction where the mutually integrated light-emitting layers 7 are arranged (various directions are possible depending on which two of the first sub-pixels P1 are selected), during the manufacture of the display device 106. Consequently, the display device 106 with high manufacturing yield can be achieved. And/or, accuracy required in apparatuses for manufacturing the display device 106 (a film formation apparatus in particular) may be lower than accuracy required in the apparatuses for manufacturing the display device 101, and accuracy required in the apparatuses for manufacturing the display device 104.

The display device 106 has n electrodes 6 provided for each contact hole CH; in other words, the display device 106 has a plurality of sets of n electrodes 6. Further, the six first sub-pixels P1 are disposed hexagonally. Furthermore, the minimum value of distance between two of the six first sub-pixels P1 is smaller than the minimum value of distance between any of the six first sub-pixels P1 and the second sub-pixel P2. In the display device 106, the minimum value of distance between two of the six first sub-pixels P1 is regarded as being equal to zero, and the minimum value of distance between any of the six first sub-pixels P1 and the second sub-pixel P2 is equal to the width W1 of a partition wall 1.

The first sub-pixels P1 all emit light of the first color, thus eliminating the need for avoiding color mixture of light between the two first sub-pixels P1. Hence, the minimum value of distance between the two first sub-pixels P1 can be rendered smaller than the minimum value of distance between the first sub-pixel P1 and the second sub-pixel P2. Consequently, the display device 106 easily achieves high luminance by increasing aperture ratio.

In the display device 106, each of the second sub-pixel P2 and the third sub-pixel P3 are disposed in a manner similar to that in the first sub-pixel P1. Moreover, a hexagon H1 composed of six first sub-pixels P1, a hexagon H2 composed of six second sub-pixels P2, and a hexagon H3 composed of six third sub-pixels P3 are congruent. Accordingly, forming (e.g., evaporation and exposure) the light-emitting layer 7 of the first sub-pixel P1, the light-emitting layer 7 of the second sub-pixel P2, and the light-emitting layer 7 of the third sub-pixel P3 by using a mask promises to bring the following effect. That is, a mask used for forming the light-emitting layer 7 of the first sub-pixel P1 can be used for forming the light-emitting layer 7 of the second sub-pixel P2 and the light-emitting layer 7 of the third sub-pixel P3. Consequently, costs for manufacturing the display device 106 can be reduced.

The display device 106 has a plurality of honeycomb-disposed hexagons H1, a plurality of honeycomb-disposed hexagons H2, and a plurality of honeycomb-disposed hexagons H3. This enables the foregoing mask to be shaped into a form opposite to the honeycomb shape, thereby achieving a form with high mechanical strength.

Seventh Embodiment

Figure 12:
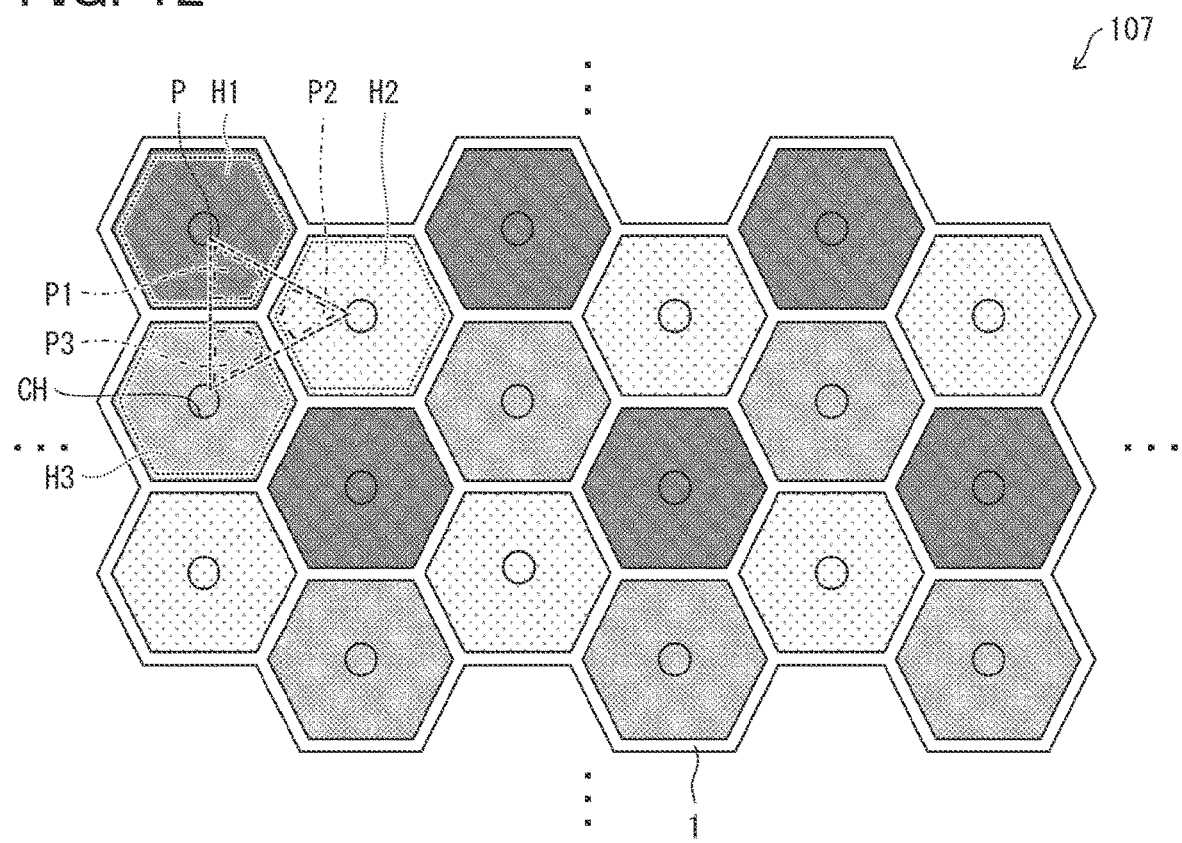
FIG. 12 is a plan view of a schematic configuration of a display device according to a seventh embodiment of the disclosure.

FIG. 12 is a plan view of a schematic configuration of a display device 107 according to a seventh embodiment of the disclosure. In FIG. 12, an imaginary line denoting a plurality of contact holes CH formed in the display device 107 is drawn.

The display device 107 is different from the display device 106 in the following point. In FIG. 12, n is equal to six in the display device 107.

To be specific, in the display device 106, the plurality of contact holes CH are formed at the respective vertexes of the hexagons H1, the respective vertexes of the hexagons H2, and the respective vertexes of the hexagons H3. In the display device 107 by contrast, the plurality of contact holes CH are formed at the respective centers of hexagons H1, the respective centers of hexagons H2, and the respective centers of hexagons H3. The placement of the first sub-pixel P1, second sub-pixel P2 and third sub-pixel P3 per se is the same as that in the display device 106 and in the display device 107.

The display device 107, which can reduce the total number of contact holes CH further than the display device 106, easily achieves high luminance by increasing aperture ratio.

Eighth Embodiment

Figure 13:
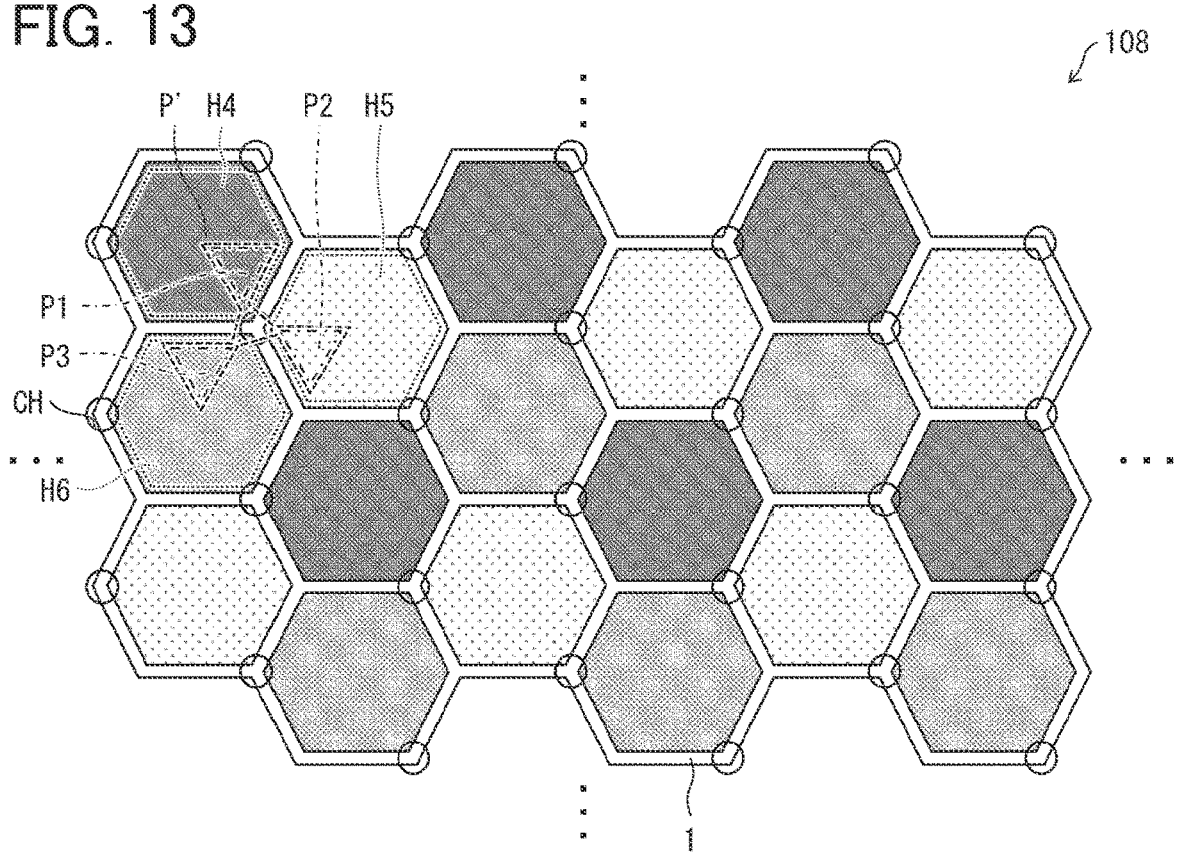
FIG. 13 is a plan view of a schematic configuration of a display device according to an eighth embodiment of the disclosure.

FIG. 13 is a plan view of a schematic configuration of a display device 108 according to an eighth embodiment of the disclosure. In FIG. 13, an imaginary line denoting a plurality of contact holes CH formed in the display device 108 is drawn.

The display device 108 is different from the display device 106 in the following point.

That is, the display device 108 has a plurality of deemed pixels P' instead of a plurality of pixels P. The deemed pixels P' can be regarded as being equivalent to the pixels P with only the exception that each deemed pixel P' does not necessarily correspond to a single pixel of the display device. The deemed pixel P' is composed of an arrangement of three-bladed sub-pixels: a first triangular sub-pixel P1, a second triangular sub-pixel P2, and a third triangular sub-pixel P3. In FIG. 13, n is equal to six in the display device 108.

To be specific, in the display device 106, the plurality of contact holes CH are formed at the respective vertexes of the hexagons H1, the respective vertexes of the hexagons H2, and the respective vertexes of the hexagons H3. In the display device 108, a single one of the plurality of contact holes CH is formed for every two adjacent vertexes of a hexagon H4, which is composed of six first sub-pixels P1. Further, in the display device 108, a single one of the plurality of contact holes CH is formed for every two adjacent vertexes of a hexagon H5, which is composed of six second sub-pixels P2. Further, in the display device 108, a single one of the plurality of contact holes CH is formed for every two adjacent vertexes of a hexagon H6, which is composed of six third sub-pixels P3. The hexagon H4 is disposed in such a manner that each of the six first sub-pixels P1 is 30° shifted with respect to the hexagon H1. The hexagon H5 is disposed in such a manner that each of the six second sub-pixels P2 is 30° shifted with respect to the hexagon H2. The hexagon H6 is disposed in such a manner that each of the six third sub-pixels P3 is 30° shifted with respect to the hexagon H3.

The display device 108, which can reduce the total number of contact holes CH further than the display device 106, easily achieves high luminance by increasing aperture ratio.

The hexagon H4, composed of the six first sub-pixels P1, the hexagon H5, composed of the six second sub-pixels P2, and the hexagon H6, composed of the six third sub-pixels P3, are congruent. Accordingly, forming (e.g., evaporation and exposure) the light-emitting layer 7 of the first sub-pixel P1, the light-emitting layer 7 of the second sub-pixel P2, and the light-emitting layer 7 of the third sub-pixel P3 by using a mask promises to bring the following effect. That is, a mask used for forming the light-emitting layer 7 of the first sub-pixel P1 can be used for forming the light-emitting layer 7 of the second sub-pixel P2 and the light-emitting layer 7 of the third sub-pixel P3. Consequently, costs for manufacturing the display device 108 can be reduced.

The display device 108 has a plurality of honeycomb-disposed hexagons H4, a plurality of honeycomb-disposed hexagons H5, and a plurality of honeycomb-disposed hexagons H6. This enables the foregoing mask to be shaped into a form opposite to the honeycomb shape, thereby achieving a form with high mechanical strength.

Figure 14:
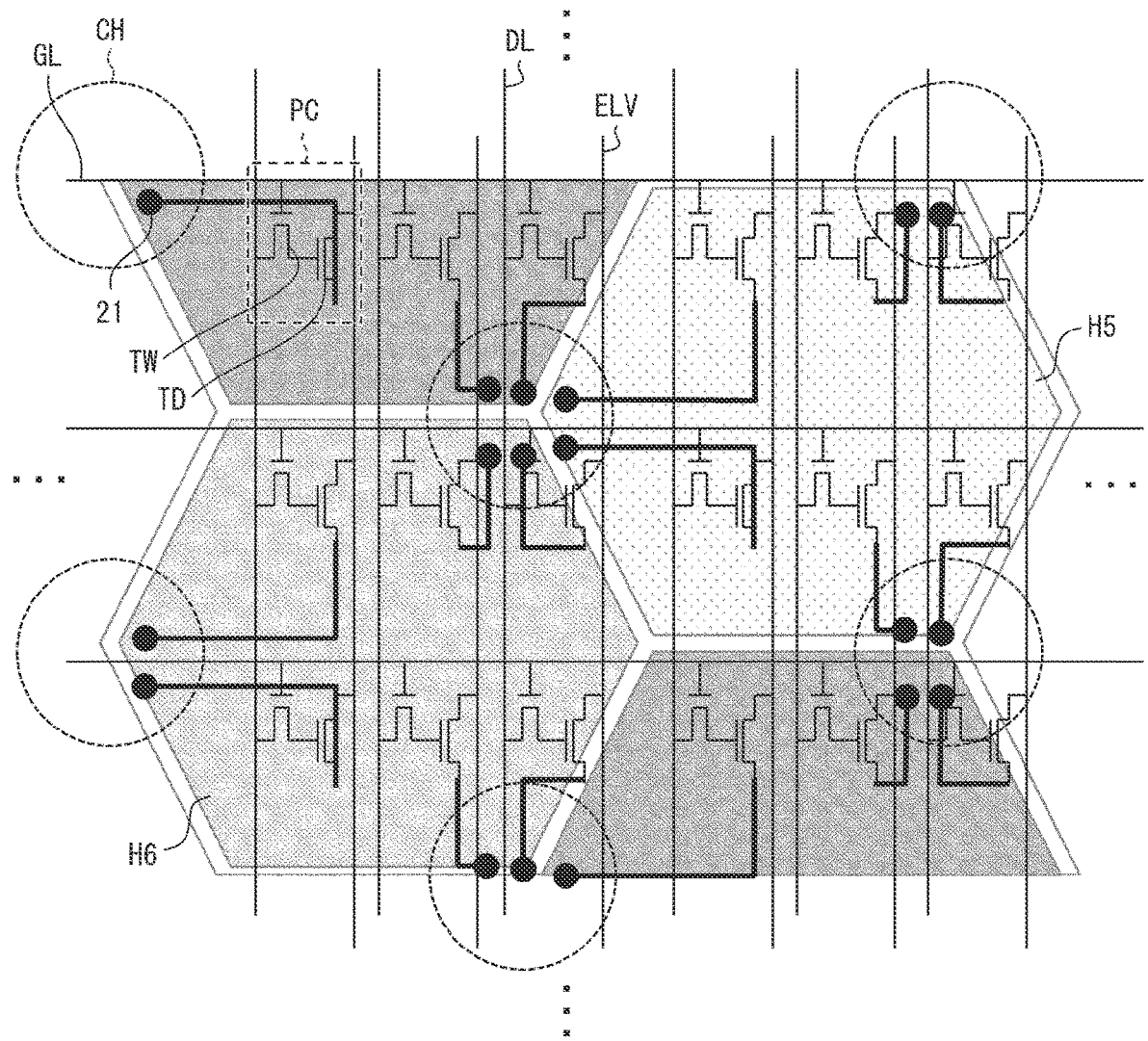
FIG. 14 illustrates an image of a first specific example of the positional relationship between a pixel circuit and a contact hole.

FIG. 14 illustrates an image of a first specific example of the positional relationship between a pixel circuit PC and a contact hole CH. That is, FIG. 14 illustrates a plurality of respective electrodes 6 corresponding to a plurality of first sub-pixels P1, a plurality of second sub-pixels P2 and a plurality of third sub-pixels P3. Furthermore, FIG. 14 illustrates a plurality of respective pixel circuits PC corresponding to the plurality of electrodes 6. In FIG. 14, an imaginary line denoting a plurality of contact holes CH formed in the display device 108 is drawn.

The pixel circuit PC has a drive transistor TD, a write transistor TW, a data signal line DL, a scan signal line GL, and a power source line ELV, all corresponding to a TFT 3. The drain of the drive transistor TD is connected to the power source line ELV. The gate of the drive transistor TD is connected to the data signal line DL via the write transistor TW. The gate of the write transistor TW is connected to the scan signal line GL.

The source of the drive transistor TD is connected to a corresponding one of the electrodes 6 at a contact portion 21. The contact portion 21 faces the opening of the contact hole CH. The source of the drive transistor TD needs to be extended to the contact portion 21, depending on the placement of the drive transistor TD.

Figure 15:
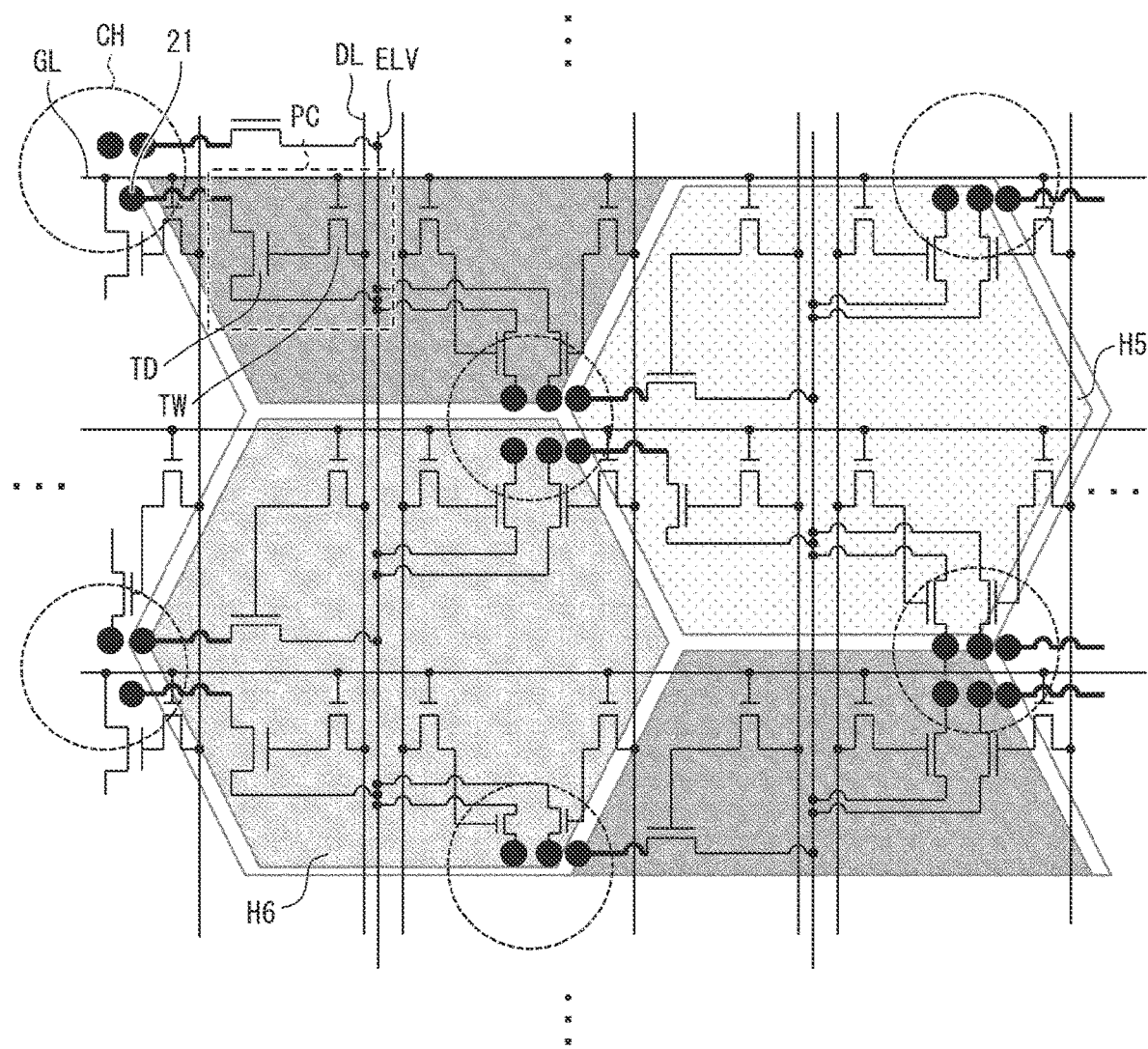
FIG. 15 illustrates an image of a second specific example of the positional relationship between the pixel circuit and the contact hole.

FIG. 15 illustrates an image of a second specific example of the positional relationship between the pixel circuit PC and the contact hole CH. In FIG. 15, an imaginary line denoting a plurality of contact holes CH formed in the display device 108 is drawn. The second specific example is different from the first specific example in the following point.

That is, in the second specific example, a path from the source of the drive transistor TD to the contact portion 21 and the power source line ELV do not intersect with each other. This enables the contact portion 21, drive transistor TD and power source line ELV to be formed in the same layer. Forming the contact portion 21 in the same layer as the drive transistor TD and power source line ELV simplifies process steps for manufacturing the display device 108. Further, the power source line ELV is disposed not to pass directly under the opening of the contact hole CH. This enables a flattening film 5 to segregate the power source line ELV, which is a large-sized wire, and the electrode 6 in a portion where they overlap each other, thereby reducing parasitic capacitance to thus easily achieve the display device 108 that is drivable with high speed.

Figure 16:
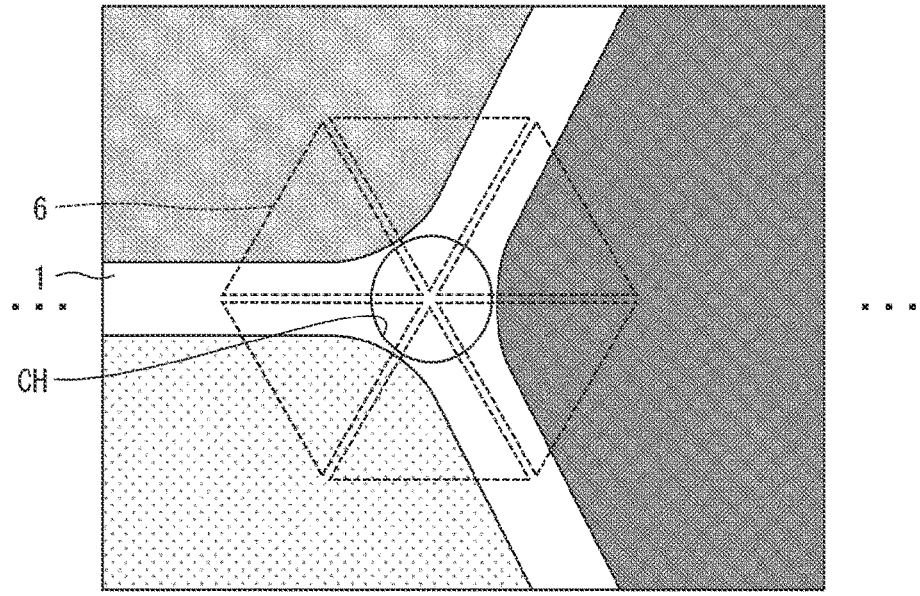
FIG. 16 illustrates an image of a first specific example of the opening shape of a contact hole.

FIG. 16 illustrates an image of a first specific example of the opening shape of the contact hole CH. That is, FIG. 16 illustrates n (six) electrodes 6 and a partition wall 1 provided in the display device 108. Moreover, in FIG. 16, an imaginary line denoting the contact hole CH formed in the display device 108 is drawn.

A single contact hole CH is formed in a circle in a top view. This has been described with reference to FIG. 1.

Figure 17:
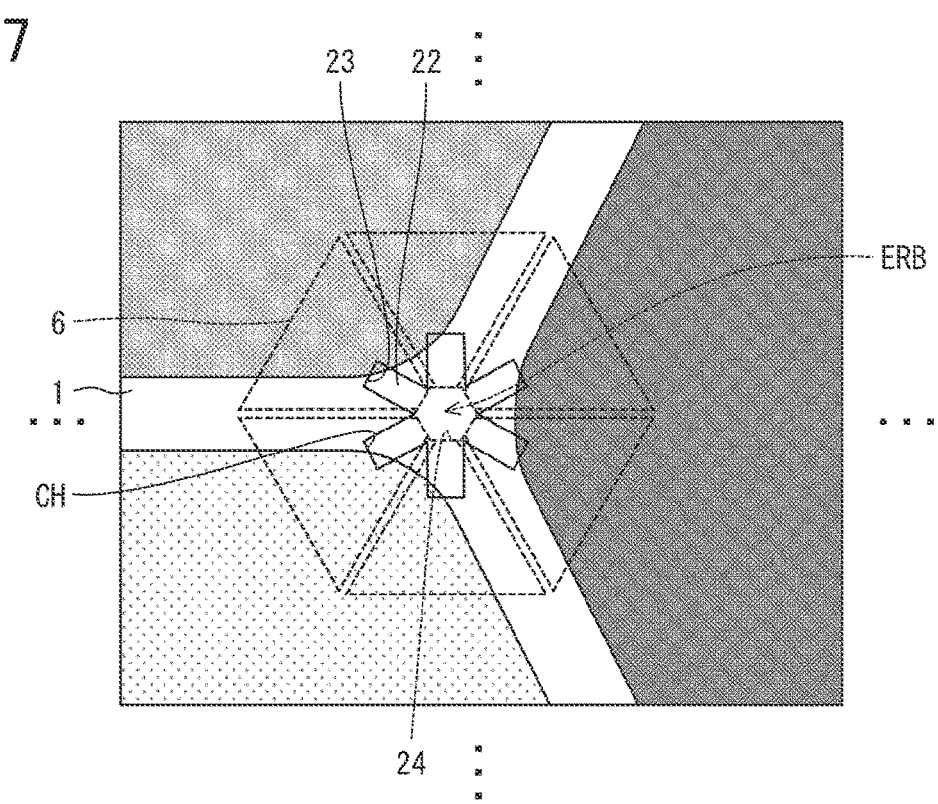
FIG. 17 illustrates an image of a second specific example of the opening shape of the contact hole.

FIG. 17 illustrates an image of a second specific example of the opening shape of the contact hole CH. In FIG. 17, an imaginary line denoting the contact hole CH formed in the display device 108 is drawn. The second specific example is different from the first specific example in the following point.

That is, a single contact hole CH is formed radially in a top view in the second specific example. To be specific, the opening shape of the single contact hole CH in a top view includes a middle opening region ERB of the single contact hole CH, and a plurality of protrusions 22 extending outward from the middle opening region ERB. Moreover, for each of the plurality of protrusions 22, one of the n electrodes 6 is formed on an inner wall 23 defining the protrusion 22 in the single contact hole CH. It is noted that the opening shape of the middle opening region ERB in a top view is a shape that constitutes a basis for the opening shape of the contact hole CH in a top view, with the plurality of protrusions 22 excluded from the opening shape of the contact hole CH in a top view. The opening shape of the middle opening region ERB in a top view, although being a hexagon in the second specific example, may be a polygon of various kinds other than a circle and a hexagon.

Further, the distance between two adjacent electrodes 6 in the second specific example is larger than that in the first specific example. Further, the ends of the electrodes 6 facing the opening of the contact hole CH are not sharp in the second specific example. This can prevent two electrodes 6 from being close to each other, thus avoiding leakage between these electrodes 6.

Further, in the second specific example, a single contact hole CH has an opening shape such that a part of its boundary is curved or bent toward the outside of a closed region. Here, the closed region is the middle opening region of a contact hole in a top view.

Further, the protrusion 22 and an edge 24 of the electrode 6 corresponding to the protrusion 22 overlap each other in the second specific example.

SUMMARY

A display device according to a first aspect of the disclosure includes at least the following: a single contact hole; n TFTs, where n is a natural number equal to or greater than two; and n electrodes, wherein the n electrodes are electrically connected to the respective n TFTs via the single contact hole.

The forgoing configuration can reduce the total number of contact holes, thus easily achieving high luminance by increasing aperture ratio.

The display device according to a second aspect of the disclosure includes, in the first aspect, the following: a substrate; and n light-emitting elements provided on the substrate, wherein each of the n light-emitting elements has, sequentially on the substrate, one of the n electrodes, a light-emitting layer, and a common electrode common to the n light-emitting elements.

The display device according to a third aspect of the disclosure includes, in the first or second aspect, a flattening film provided between the n TFTs and the n electrodes, wherein the single contact hole is formed in the flattening film.

The display device according to a fourth aspect of the disclosure is configured, in any one of the first to third aspects, such that n is equal to three.

The display device according to a fifth aspect of the disclosure is configured, in any one of the first to third aspects, such that n is equal to four.

The display device according to a six aspect of the disclosure is configured, in any one of the first to third aspects, such that n is equal to six.

The display device according to a seventh aspect of the disclosure is configured, in any one of the first to sixth aspects, such that the single contact hole is formed in a circle in a top view.

The display device according to an eighth aspect of the disclosure is configured, in any one of the first to sixth aspects, such that the opening shape of the single contact hole in a top view includes a middle opening region of the single contact hole, and a plurality of protrusions extending outward from the middle opening region, and such that for each of the plurality of protrusions, one of the n electrodes is formed on an inner wall defining the protrusion in the single contact hole.

The display device according to a ninth aspect of the disclosure is configured, in the eighth aspect, such that the single contact hole has an opening shape such that a part of the boundary of the single contact hole is curved or bent toward the outside of a closed region.

The display device according to a tenth aspect of the disclosure is configured, in the eighth aspect, such that the protrusion and an edge of the electrode corresponding to the protrusion overlap each other.

The display device according to an eleventh aspect of the disclosure includes, in any one of the first and fourth to sixth aspects, the following: a plurality of sets of the n electrodes; at least two first sub-pixels corresponding to one of the n electrodes and configured to emit light of a first color; and a second sub-pixel corresponding to one of the n electrodes and configured to emit light of a second color different from the first color, wherein the at least two first sub-pixels are adjacent to each other, and the minimum value of distance between the at least two first sub-pixels is smaller than the minimum value of distance between either of the at least two first sub-pixels and the second sub-pixel.

The first sub-pixels all emit light of the first color, thus eliminating the need for avoiding color mixture of light between the two first sub-pixels. Hence, the minimum value of distance between the two first sub-pixels can be rendered smaller than the minimum value of distance between the first sub-pixels and the second sub-pixel. Consequently, the foregoing configuration easily achieves high luminance by increasing aperture ratio.

The display device according to a twelfth aspect of the disclosure includes, in any one of the first, fourth and sixth aspects, the following: a plurality of sets of the n electrodes; at least three first sub-pixels corresponding to one of the n electrodes and configured to emit light of a first color; and a second sub-pixel corresponding to one of the n electrodes and configured to emit light of a second color different from the first color, wherein the at least three first sub-pixels are adjacent to each other in rows and columns, and the minimum value of distance between two of the at least three first sub-pixels is smaller than the minimum value of distance between any of the at least three first sub-pixels and the second sub-pixel.

The first sub-pixels all emit light of the first color, thus eliminating the need for avoiding color mixture of light between the two first sub-pixels. Hence, the minimum value of distance between the two first sub-pixels can be rendered smaller than the minimum value of distance between the first sub-pixels and the second sub-pixel. Consequently, the foregoing configuration easily achieves high luminance by increasing aperture ratio.

The display device according to a thirteenth aspect of the disclosure includes, in any one of the first, fourth and sixth aspects, the following: a plurality of sets of the n electrodes; at least six first sub-pixels corresponding to one of the n electrodes and configured to emit light of a first color; and a second sub-pixel corresponding to one of the n electrodes and configured to emit light of a second color different from the first color, wherein the at least six first sub-pixels are disposed hexagonally, and the minimum value of distance between two of the at least six first sub-pixels is smaller than the minimum value of distance between any of the at least six first sub-pixels and the second sub-pixel.

The first sub-pixels all emit light of the first color, thus eliminating the need for avoiding color mixture of light between the two first sub-pixels. Hence, the minimum value of distance between the two first sub-pixels can be rendered smaller than the minimum value of distance between the first sub-pixels and the second sub-pixel. Consequently, the foregoing configuration easily achieves high luminance by increasing aperture ratio.

The display device according to a fourteenth aspect of the disclosure is configured, in any one of the eleventh to thirteenth aspects, such that each of the at least two first sub-pixels has a light-emitting layer that emits light of the first color, and the light-emitting layers of the individual at least two first sub-pixels are formed integrally.

The foregoing configuration can avoid a display device from resulting in a faulty finished product resulting from a positional deviation of at least one light-emitting layer in the direction where the mutually integrated light-emitting layers are arranged, during the manufacture of the display device. Consequently, a display device with high manufacturing yield can be achieved. And/or, accuracy required in apparatuses for manufacturing a display device (a film formation apparatus in particular) can be lowered.

The display device according to a fifteenth aspect of the disclosure includes, in any one of the eleventh to thirteenth aspects, a partition wall between the at least two first sub-pixels, and a partition wall between either of the at least two first sub-pixels and the second sub-pixel, wherein the width of the partition wall formed between the at least two first sub-pixels is smaller than the width of the partition wall formed between either of the at least two first sub-pixels and the second sub-pixel.

The foregoing configuration eliminates the need for avoiding color mixture of light between the two first sub-pixels, thus enabling reduction in the width of the partition wall formed between the two first sub-pixels. Hence, the minimum value of distance between the two first sub-pixels can be rendered smaller than the minimum value of distance between the first sub-pixels and the second sub-pixel.

The display device according to a sixteenth aspect of the disclosure includes, in any one of the eleventh to thirteenth aspect, a partition wall between either of the at least two first sub-pixels and the second sub-pixel, wherein no partition wall is formed between the at least two first sub-pixels.

The foregoing configuration eliminates the need for avoiding color mixture of light between the two first sub-pixels, thus eliminating the need for forming a partition wall between the two first sub-pixels. Hence, the minimum value of distance between the two first sub-pixels can be rendered smaller than the minimum value of distance between the first sub-pixels and the second sub-pixel.

The display device according to a seventeenth aspect of the disclosure includes, in any one of the eleventh to thirteenth aspect, a partition wall between either of the at least two first sub-pixels and the second sub-pixel, wherein the single contact hole is formed directly under the partition wall.

The foregoing configuration can easily achieve a contact hole cover covering the contact hole by the use of the partition wall.

The display device according to an eighteenth aspect of the disclosure is configured, in any one of the first to seventeenth aspect, such that at least one of the n TFTs is disposed to face the opening of the single contact hole.

The disclosure is not limited to the foregoing embodiments and can be modified in various manners within the scope of the claims. The technical scope of the disclosure includes an embodiment that is obtained in combination as necessary with technical means disclosed in the respective embodiments. In addition, combining the technical means disclosed in the respective embodiments can form a new technical feature.

The invention claimed is:
1. A display device comprising at least:
 a single contact hole;
 n thin-film transistors (TFTs), where n is a natural number equal to or greater than two;

a plurality of sets of n electrodes;
at least two first sub-pixels corresponding to one of n electrodes, among the plurality of sets of n electrodes, and configured to emit light of a first color; and
a second sub-pixel corresponding to another one of the n electrodes and configured to emit light of a second color, different from the first color,
wherein the n electrodes are, respectively, electrically connected to the n TFTs via the single contact hole,
the at least two first sub-pixels are adjacent to each other, and
a minimum value of a distance between the at least two first sub-pixels is smaller than a minimum value of a distance between either one of the at least two first sub-pixels and the second sub-pixel.

2. The display device according to claim 1, wherein
each of the at least two first sub-pixels has a light-emitting layer that emits light of the first color, and
the light-emitting layers of each of the at least two first sub-pixels are formed integrally.

3. The display device according to claim 1, further comprising a partition wall between the at least two first sub-pixels, and another partition wall between either one of the at least two first sub-pixels and the second sub-pixel,
wherein a width of the partition wall formed between the at least two first sub-pixels is smaller than a width of the other partition wall formed between either one of the at least two first sub-pixels and the second sub-pixel.

4. The display device according to claim 1, further comprising a partition wall between either one of the at least two first sub-pixels and the second sub-pixel,
wherein no partition wall is formed between the at least two first sub-pixels.

5. The display device according to claim 1, further comprising a partition wall between either one of the at least two first sub-pixels and the second sub-pixel,
wherein the single contact hole is formed directly under the partition wall.

6. The display device according to claim 1, wherein at least one of the n TFTs is disposed to face an opening of the single contact hole.

7. The display device according to claim 1, wherein n is equal to three.

8. The display device according to claim 1, wherein n is equal to four.

9. The display device according to claim 1, wherein n is equal to six.

10. A display device comprising at least:
a single contact hole;
n thin-film transistors (TFTs), where n is a natural number equal to or greater than two; and
n electrodes,
wherein the n electrodes are, respectively, electrically connected to the n TFTs via the single contact hole,
an opening shape of the single contact hole in a top view includes a middle opening region of the single contact hole, and a plurality of protrusions extending outward from the middle opening region, and
for each of the plurality of protrusions, one of the n electrodes is formed on an inner wall defining the protrusion in the single contact hole.

11. The display device according to claim 10, further comprising:
a substrate; and
n light-emitting elements provided on the substrate,
wherein each of the n light-emitting elements has, sequentially on the substrate, the one of the n electrodes, a light-emitting layer, and a common electrode common to the n light-emitting elements.

12. The display device according to claim 10, further comprising a flattening film provided between the n TFTs and the n electrodes,
wherein the single contact hole is formed in the flattening film.

13. The display device according to claim 10, wherein n is equal to three.

14. The display device according to claim 10, wherein n is equal to four.

15. The display device according to claim 10, wherein n is equal to six.

16. The display device according to claim 10, wherein the single contact hole has an opening shape such that a part of a boundary of the single contact hole is curved or bent toward an outside of a closed region.

17. The display device according to claim 10, wherein the protrusion and an edge of the one of the n electrodes corresponding to the protrusion overlap each other.

* * * * *